United States Patent
Chen et al.

(10) Patent No.: US 6,542,112 B1
(45) Date of Patent: Apr. 1, 2003

(54) INTERFERENCE CANCELLATION IN ANTENNA TEST

(75) Inventors: Xiaofen Chen, West Linn, OR (US); Soraya J. Matos, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/093,152

(22) Filed: Mar. 6, 2002

(51) Int. Cl.$^7$ .................................................. G01S 7/40
(52) U.S. Cl. ...................................................... 342/165
(58) Field of Search ......................................... 342/165

(56) References Cited

U.S. PATENT DOCUMENTS

| | | | |
|---|---|---|---|
| 4,075,566 A | * 2/1978 | D'Arcangelis | 455/276.1 |
| 4,470,120 A | * 9/1984 | Haylett | 198/810.02 |
| 5,260,660 A | * 11/1993 | Stolarczyk | 324/338 |
| 5,565,870 A | * 10/1996 | Fukuhara et al. | 342/70 |
| 5,642,039 A | 6/1997 | Bradley et al. | 324/76.53 |
| 5,808,578 A | * 9/1998 | Barbella et al. | 342/62 |

* cited by examiner

*Primary Examiner*—Thomas H. Tarcza
*Assistant Examiner*—Isam Alsomiri
(74) *Attorney, Agent, or Firm*—Francis I. Gray

(57) ABSTRACT

A method of interference cancellation in antenna test measurements is achieved by acquiring an acquisition at a test port of an antenna test instrument in response to an internal signal source, stamping the data acquisition time, and measuring a signal vector that has both a reflection signal component and an interference signal component. Another acquisition at the test port without the internal signal source is obtained with limited data points to detect whether there are interference signals. If there is significant interference power, a complete acquisition is obtained without the internal signal source, the data acquisition time is stamped, and an interference vector that has only the interference signal is measured. Then the interference frequency is measured, an interference phase shift between the two data acquisitions is calculated, an interference vector for the combined reflection/interference vector is predicted using the interference vector and the phase shift, and the predicted interference vector is subtracted from the signal vector to obtain the actual reflection signal for the antenna in the absence of interference.

5 Claims, 3 Drawing Sheets

INTERFERENCE CANCELLATION IN ANTENNA TEST

BACKGROUND OF THE INVENTION

The present invention relates to network analyzers, and more particularly to a method of canceling interference effects on measurement results of antenna systems.

Interference often exists in antenna systems. For example in a typical communications environment there may be several base stations within a service area such that energy from one base station may be picked up by the antenna of another, causing confusing results when measurements are performed on a particular antenna of interest.

Current interference cancellation techniques include that disclosed in U.S. Pat. No. 5,642,039 by Donald A. Bradley et al, issued Jun. 24, 1997 and entitled "Handheld Vector Network Analyzer". This patent discloses a method of operating a vector network analyzer in the presence of external signals, i.e., interference, with reduced error. A reference oscillator is dithered over a narrow range of frequencies for each measurement so that interference occurs only over a small frequency range, substantially reducing the possibility of error. This solution is hardware-based, and the interference cancellation effect is not consistent across measurement acquisitions. In fact for some acquisitions it may cancel interference well, but for others large residuals remain.

What is desired is a method of interference cancellation in antenna test measurements that is not hardware dependent and provides consistent and reliable cancellation results efficiently and effectively.

BRIEF SUMMARY OF THE INVENTION

Accordingly the present invention provides interference cancellation in antenna test measurements by acquiring an acquisition at a reflection port of an antenna test instrument in response to an internal signal source, stamping the data acquisition time, and measuring a projection vector that has both a reflection signal component and an interference signal component. Another acquisition at the reflection port is performed without the internal signal source using a limited set of data, and a projection vector that has only the interference signal, if any, is examined to detect whether there is a significant interference signal. If there is significant power in the interference only projection vector, a full acquisition of the interference only signal is made, the data acquisition time is stamped, the interference frequency is measured, an interference phase shift between the two data acquisitions is calculated, an interference vector for the combined reflection/interference vector is predicted using the interference vector and the phase shift, and the predicted interference vector is subtracted from the combined reflection/interference vector to obtain the actual reflection signal for the antenna in the absence of interference.

The objects, advantages and other novel features of the present invention are apparent from the following detailed description when read in conjunction with the appended claims and attached drawing.

DETAILED DESCRIPTION OF THE INVENTION

Figure 1:
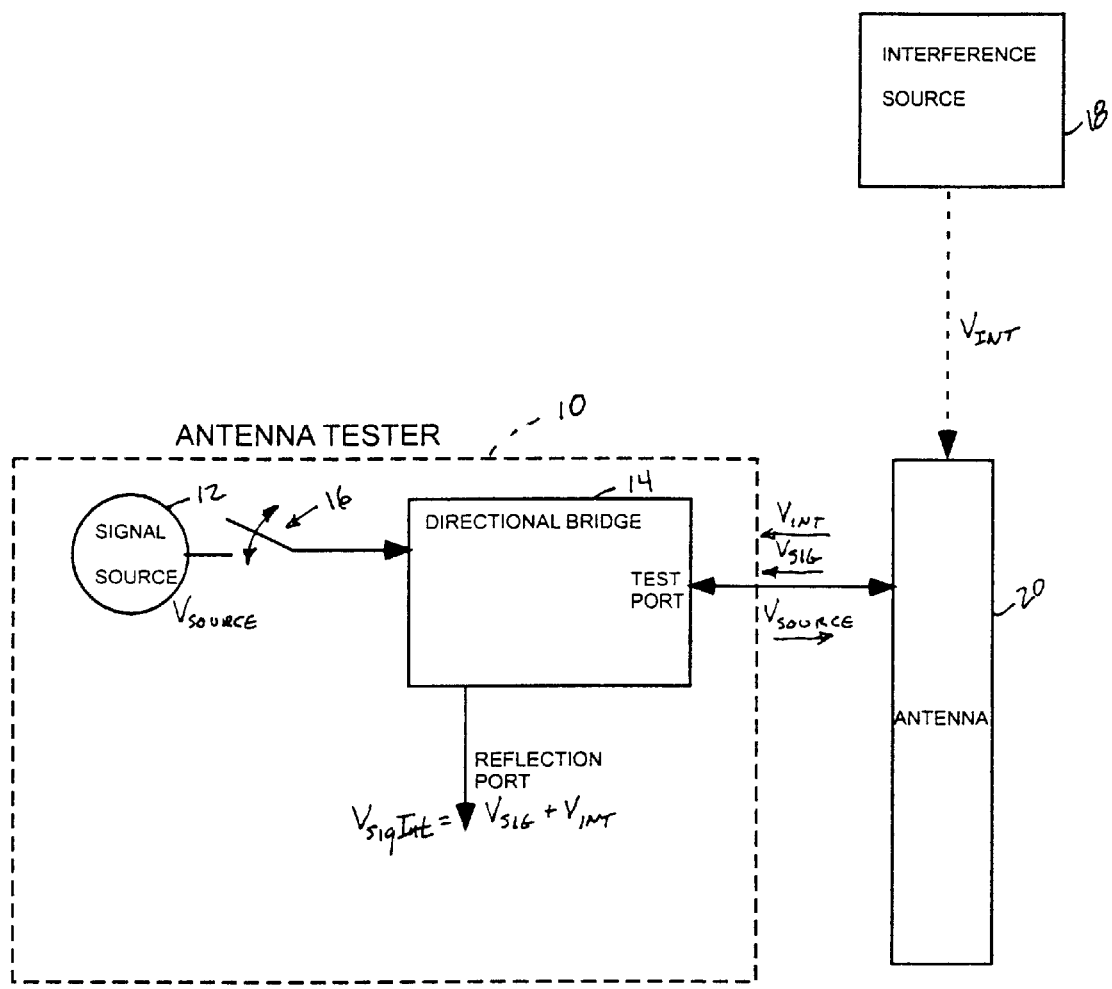
FIG. 1 is a block diagram view of an instrument test set-up for interference cancellation according to the present invention.

Referring now to FIG. 1 a simple antenna test instrument 10 is shown having an internal signal source 12 and a directional bridge 14. The internal signal source 12 is selectable by a switch 16 to be either "on" or "off", and when "on" may sweep through a range of frequencies in discrete frequency steps, as is well-known in the art. An external interference source 18, such as another mobile base station, also radiates energy that may be picked up by an antenna 20 coupled to a test port of the directional bridge 14. This external energy is interference.

Figure 2:
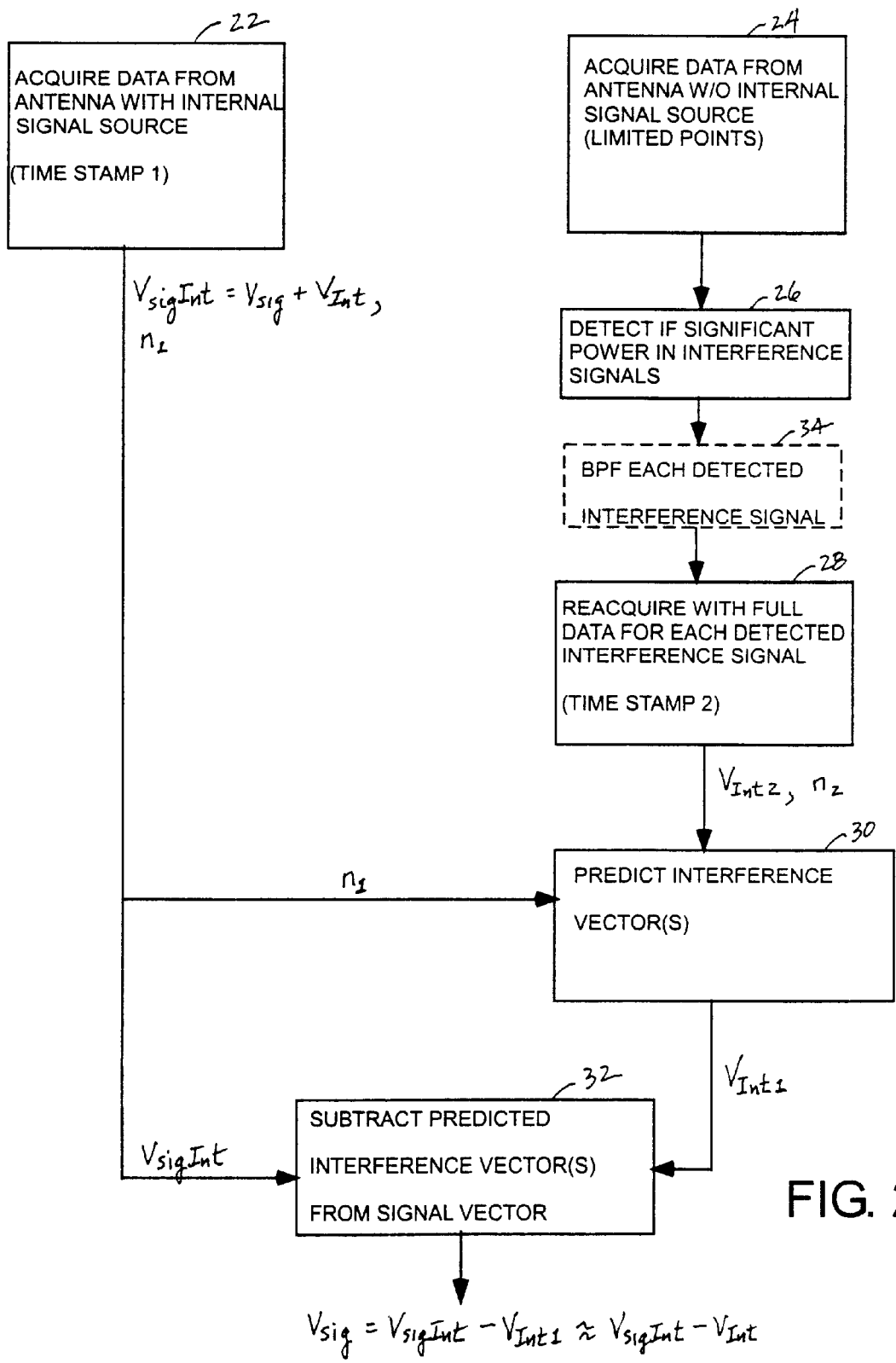
FIG. 2 is a simplified flow diagram view of interference cancellation according to the present invention.

As shown in FIG. 2 a signal vector acquisition, $V_{sigInt}$, reflected from the antenna 20 is obtained at the test port in response to the energy generated from the internal signal source 12 in step 22. The reflected signal is detected, processed and stored in a control processor (not shown) as complex (I, Q) components representing the signal, $V_{sig}$, with interference, $V_{Int}$. Another vector acquisition is obtained in step 24 with the internal signal source 12 disabled using only a few data points to detect in step 26 whether there are any significant interference signals in the environment. If there is a significant interference signal, then a complete acquisition is obtained in step 28 for the interference signal vector, $V_{Int2}$, alone (with the internal signal source 12 disabled). This produces a set of complex components representing the interference signal vector. Both sets of signal acquisitions may be time stamped. From the respective vectors and the time differential between acquisitions a predicted interference signal component, $V_{Int1}$, of the signal with interference is determined in step 30, as described below, and subtracted in step 32 to obtain the signal without interference.

In the antenna test instrument 10 the received reflection signal at the test port may be represented as:

$$x(n) = A \sin(2\pi f_{if} n + \theta) + w(n)$$

where $f_{if}$ is a normalized intermediate frequency and $w(n)$ is an additive white Gaussian noise (AWGN) component. To illustrate the present invention, set $f_{if} = 0.25$. Then $$x(0) = A \sin\theta + w(0)$$
$$X(1) = A \cos\theta + w(1)$$
$$X(2) = -A \sin\theta + w(2)$$
$$X(3) = -A \cos\theta + w(3)$$
$$X(4) = A \sin\theta + w(4)$$

A signal vector, $V_{sig}$, may be determined from the following formula:

$$Q_{sig} = A \sin\theta = (1/(2N))\Sigma_{n=0 \to N-1}(x(4n) - x(4n+2))$$
$$I_{sig} = A \cos\theta = (1/(2N))\Sigma_{n=0 \to N-1}(x(4n+3))$$
$$V_{sig} = I_{sig} + jQ_{sig}$$

When there is a continuous wave (CW) interference, which is generally the most significant source of interference, the received reflection signal becomes:

$$x_1(n)=A\sin(2\pi f_{if}n+\theta)+B\sin(2\pi f_{if}n+2\pi\delta f n+\phi_1)+w(n)=x(n)+v_1(n)$$

Figure 3:
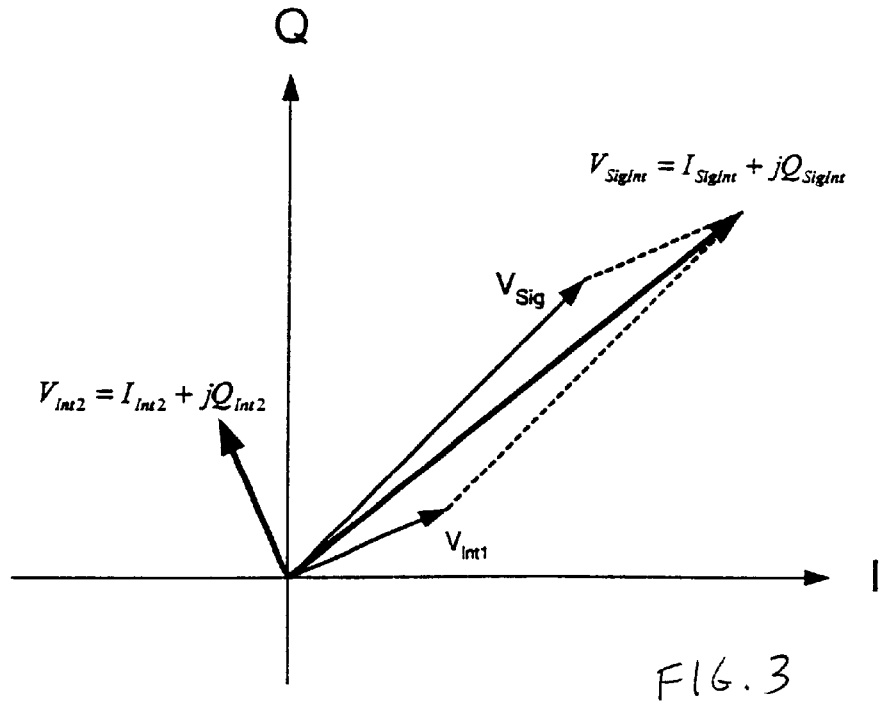
FIG. 3 is a vector diagram view of the measured signal vectors involved in interference cancellation according to the present invention.

The interference frequency is $f_{Int}=f_{if}+\delta f$. The signal vector $V_{sigint}$ becomes:

$$V_{sigint}=sig+V_{Int1}$$

where $V_{Int1}$ is the interference projected on the signal space of $f_{if}$, as shown in FIG. 3.

$$V_{Int1} = I_{Int1} + jQ_{Int1}$$

$$Q_{Int1} = (1/(2N))\sum_{n=0->N-1}(v_1(4n)-v_1(4n+2))$$

$$= (1/(2N))\sum_{n=0->N-1}(B\sin(2\pi\delta 4n+\varphi_1)+B\sin(2\pi\delta(4n+2)+\varphi_1))$$

$$= (1/N)\sum_{n=0->N-1}(B\sin(2\pi\delta(4n+1)+\varphi_1)\cos(2\pi\delta)$$

$$I_{Int1} = (1/(2N))\sum_{n=0->N-1}(v_1(4n+1)-v_1(4n+3))$$

$$= (1/(2N))\sum_{n=0->N-1}(B\cos(2\pi\delta(4n+1)+\varphi_1)+B\cos(2\pi\delta(4n+3)+\varphi_1))$$

$$= (1/N)\sum_{n=0->N-1}(B\cos(2\pi\delta(4n+2)+\varphi_1)\cos(2\pi\delta)$$

When the internal signal source 12 from the antenna test instrument 10 is turned off, the received reflection signal is only the interference signal, $V_{Int2}$:

$$v_2(n) = B\sin(2\pi f_{if}n+2\pi\delta f n+\varphi_2)+w(n)$$

$$= B\sin(2\pi f_{if}n+2\pi\delta f n+\varphi_1+\varphi)+w(n)$$

Here $\phi=2\pi(f_{if}+\delta f)(n_2-n_1)$ where $n_1$ is a time stamp of data acquisition $x_1(n)$ and $n_2$ is the time stamp of data acquisition $v_2(n)$. The projection of $v_2(n)$ on the signal space of $f_{if}$ is given by $$Q_{Int2} = (1/2N)\sum_{n=0->N-1}(v_2(4n)-v_2(4n+2))$$

$$= (1/N)\sum_{n=0->N-1}(B\sin(2\pi\delta(4n+1)+\varphi_1+\varphi)\cos(2\pi\delta)$$

$$= (B\cos 2\pi\delta/N)\sum_{n=0->N-1}(\sin(2\pi\delta(4n+1)+\varphi_1)\cos\varphi + \cos(2\pi\delta(4n+1)+\varphi_1)\sin\varphi)$$

$$I_{Int2} = (1/2N)\sum_{n=0->N-1}(v_2(4n+1)-v2(4n+3))$$

$$= (1/N)\sum_{n=0->N-1}(B\cos(2\pi\delta(4n+2)+\varphi_1+\varphi)\cos(2\pi\delta)$$

$$= (B\cos 2\pi\delta/N)\sum_{n=0->N-1}\cos(2\pi\delta(4n+2)+\varphi_1)\cos\varphi - \sin(2\pi\delta(4n+2)+\varphi_1)\sin\varphi)$$

The vector $V_{Int2}=I_{Int2}+jQ_{Int2}$ is directly measurable. Since $$Q_{Int2}=Q_{Int1}\cos\phi+I_{Int1}\sin\phi$$

$$I_{Int2}=I_{Int1}\cos\phi-Q_{Int1}\sin\phi$$

the prediction of the interference signal component of vector $V_{sigint}$ is $$Q_{Int1}=Q_{Int2}\cos\phi-I_{Int2}\sin\phi$$

$$I_{Int1}=I_{Int2}\cos\phi+Q_{Int2}\sin\phi$$

$$V_{Int1}=(I_{int2}\cos\phi+Q_{Int2}\sin\phi)+j(Q_{Int2}\cos\phi-I_{Int2}\sin\phi)$$

i.e., $V_{Int}$ is predicted by rolling back $V_{Int2}$ in time (phase shifting). By subtracting $V_{Int1}=I_{Int1}+jQ_{Int1}$ from $V_{sigInt}$ interference suppression or cancellation is achieved.

There are many ways for measuring the interference signal frequency. One such way is described by B. G. Quinn in "Estimation of Frequency, Amplitude, and Phase from the DFT of a Time Series", IEEE Trans. Signal Processing, Vol. 45, No. 3, pp. 814–817, March 1997.

Let $Y(f)=Y_I(f)+jY_Q(f)$ denote the discrete Fourier transform (DFT) value of interference signal $v_2(n)$ Search for a bin number of the maximum magnitude $|Y(f)|$ over the search range. Denote as k=bin_max Calculate $$ap=(Y_I(k+1)Y_I(k)+Y_Q(k+1)Y_Q(k))/(Y_I(k)^2+Y_Q(k)^2)$$

$$dp=-ap/(1-ap)$$

$$am=(Y_I(k-1)Y_I(k)+Y_Q(k-1)Y_Q(k))/(Y_I(k)^2+Y_Q(k)^2)$$

$$dm=am/(1-am)$$

$$d=(dp+dm)/2+\tau(dp^2)-\tau(dm^2)$$

where $$\tau(x)=(ln(3x^2+6x+1))/4-(SQRT(6)/24)ln((x+-1-SQRT(2/3))/(x+1+SQRT(2/3)))$$

the final peak frequency index equals k+d.

$\phi$ may be derived from directly measuring $\phi_1$ and $\phi_2$ in $x_1(n)$ and $v_2(n)$ after measuring the frequency of the interference signal without the necessity of time stamping the acquisitions. From the measured interference frequency, the known intermediate frequency $f_{IF}$ and the measured reflection coefficients, the values of $\phi_2$ and $\phi_1$ may be determined from, for example, least-squares estimation. As an example for the combined signal:

$$x_1(n)=A\sin(2\pi f_{iF}n+\theta)+B\sin(2\pi f_{Int}n+\phi_1)+w(n)$$

In matrix form:

$$X=D\phi$$

where $X=[x_1(0), x_1(1), \ldots, x_1(N)]^T$ and $$D=\begin{bmatrix} \sin(2\pi f_{IF}0) & \cos(2\pi f_{IF}0) & \sin(2\pi f_{Int}0) & \cos(2\pi f_{Int}0) \\ \sin(2\pi f_{IF}) & \cos(2\pi f_{IF}) & \sin(2\pi f_{Int}) & \cos(2\pi f_{Int}) \\ \vdots & \vdots & \vdots & \vdots \\ \sin(2\pi f_{IF}N) & \cos(2\pi f_{IF}N) & \sin(2\pi f_{Int}N) & \cos(2\pi f_{Int}N) \end{bmatrix}$$

$$\phi=[A\cos\theta, A\sin\theta, B\cos\phi_1, B\sin\phi_1]T$$

$$\phi=(D^TD)^{-1}D^TX$$

$$\phi_1=tg^{-1}(\phi(3)/\phi(2))$$

Figure 4:
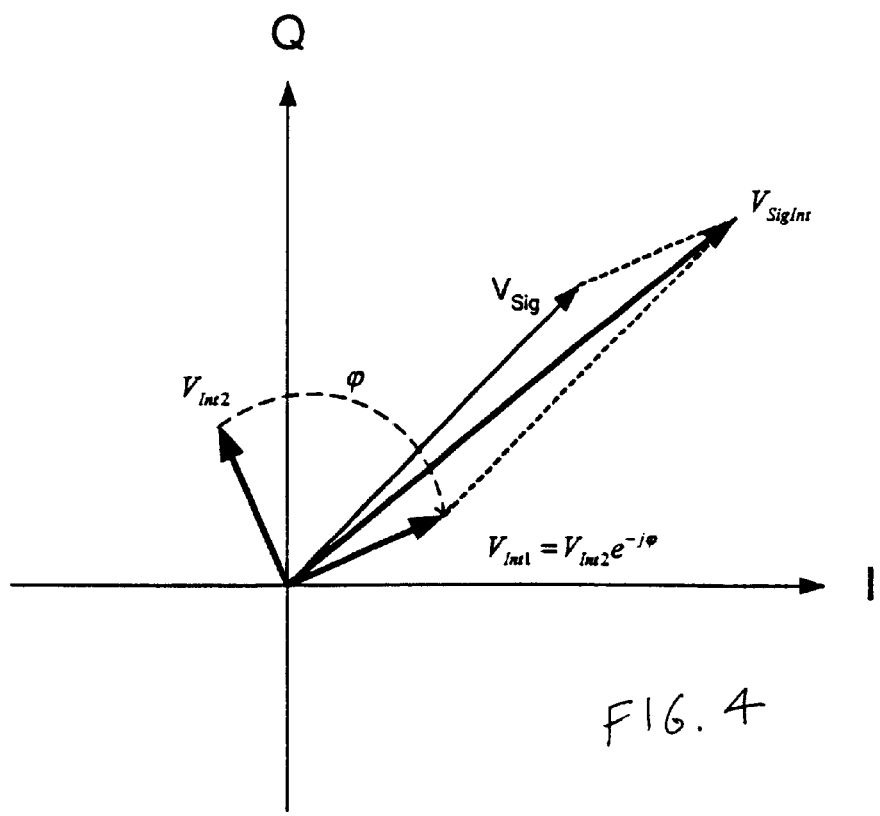
FIG. 4 is a vector diagram view illustrating interference cancellation according to the present invention.

From $\phi=\phi_2-\phi_1$ the predicted interference signal may be determined for subtraction from $V_{sigInt}$ to obtain $V_{sig}$ as shown in FIG. 4.

This interference cancellation method works well, not only for CW interference signals, but also for modulated signals. For multiple CW-like interference signals their projection vectors are calculated separately. This is achieved by bandpass filtering each interference component in signal $v_2(n)$ and calculating each projection vector in $x_1(n)$ using the formulae described above, as indicated in step 34 of FIG. 2.

Thus the present invention provides interference cancellation in antenna testing by acquiring a signal vector with a time stamp that includes both signal and interference, acquiring an interference vector with a time stamp in the absence of signal, measuring the interference frequency, calculating an interference phase shift between the two acquisitions, predicting the interference vector in the signal vector, and subtracting the predicted interference vector from the signal vector to cancel or suppress the interference in the signal vector.

What is claimed is:

1. A method of interference cancellation in antenna testing comprising the steps of:

acquiring a signal vector for an antenna under test when excited by an internal signal source, the signal vector including both signal and interference components;

acquiring an interference vector for the antenna under test when the internal signal source is disabled;

predicting from the signal vector and the interference vector a predicted interference vector for the signal vector; and subtracting the predicted interference vector from the signal vector to cancel the interference component in the signal vector.

2. The method as recited in claim 1 wherein the predicting step comprises the steps of:

measuring a frequency for the interference vector;

based on a time difference between the signal and interference vector acquiring steps and the frequency, calculating an interference phase shift between the two acquiring steps; and predicting the predicted interference vector from the interference vector and the interference phase shift.

3. The method as recited in claim 1 wherein the predicting step comprises the steps of:

measuring a frequency for the interference vector;

based on the frequency, calculating an interference phase shift between the interference vector and an interference portion of the signal vector; and predicting the predicted interference vector from the interference vector and the interference phase shift.

4. The method as recited in claim 1 wherein the interference vector acquiring step comprises the steps of:

acquiring an initial interference vector for the antenna under test when the internal source is disabled using a limited data set;

detecting from the initial interference vector the presence of a significant interference signal; and acquiring the interference vector for the antenna under test when the internal source is disabled using a complete data set.

5. The method as recited in claim 4 wherein the predicting step comprises the steps of:

measuring a frequency for each significant interference signal detected;

bandpass filtering each significant interference signal;

calculating the interference vector for each interference signal: and predicting the predicted interference vector for each interference vector from the corresponding interference vector and interference phase shift.

\* \* \* \* \*